(12) United States Patent
Hogendoorn et al.

(10) Patent No.: US 10,393,558 B2
(45) Date of Patent: Aug. 27, 2019

(54) METHOD FOR OPERATING A NUCLEAR MAGNETIC FLOWMETER

(71) Applicant: Krohne AG, Basel (CH)

(72) Inventors: Cornelis Johannes Hogendoorn, Sijk (NL); Rutger Reinout Tromp, Dordrecht (NL); Olaf Jean Paul Bousché, Dordrecht (NL); Marco Leendert Zoeteweij, Hendrik-Ido-Ambach (NL); Lucas Matias Ceferino Cerioni, Dordrecht (NL)

(73) Assignee: KROHNE AG, Basel (CH)

(*) Notice: Subject to any disclaimer, the term of this patent is extended or adjusted under 35 U.S.C. 154(b) by 921 days.

(21) Appl. No.: 14/795,204

(22) Filed: Jul. 9, 2015

(65) Prior Publication Data

US 2016/0011032 A1 Jan. 14, 2016

(30) Foreign Application Priority Data

Jul. 10, 2014 (DE) .......................... 10 2014 010 237
Oct. 30, 2014 (DE) .......................... 10 2014 015 943

(51) Int. Cl.
*G01F 1/74* (2006.01)
*G01F 1/716* (2006.01)
*G01R 33/30* (2006.01)

(52) U.S. Cl.
CPC .............. *G01F 1/716* (2013.01); *G01F 1/74* (2013.01); *G01R 33/307* (2013.01)

(58) Field of Classification Search
CPC .......... G01F 1/716; G01F 1/74; G01R 33/307

USPC ......................................................... 324/306
See application file for complete search history.

(56) References Cited

U.S. PATENT DOCUMENTS

| | | | |
|---|---|---|---|
| 4,769,602 A | 9/1988 | Vinegar et al. | |
| 4,855,695 A | 8/1989 | Samardzija | |
| 6,046,587 A * | 4/2000 | King ..................... | E21B 47/102 324/306 |
| 9,335,195 B2 | 5/2016 | Ong et al. | |
| 9,797,974 B2 * | 10/2017 | Cheng .............. | G01R 33/56509 |

(Continued)

FOREIGN PATENT DOCUMENTS

| | | |
|---|---|---|
| EP | 0 510 774 A2 | 10/1992 |
| WO | 9859220 A2 | 12/1998 |

(Continued)

*Primary Examiner* — Jay Patidar

(74) *Attorney, Agent, or Firm* — David S. Safran; Roberts Mlotkowski Safran Cole & Calderon, P.C.

(57) ABSTRACT

A method for operating a nuclear magnetic flowmeter for determining the flow of a slug flow medium flowing through a measuring tube, with which "tuning" parameters and "matching" parameters are set for a slug zone a film zone, reflected power is measured over time. If the reflected power in a system set for slug zone is low for the slug zone and high for the film zone and if the reflected power in a system set for film zone is low for the film zone and high for the slug zone, relative dwell time of the slug zone and the film zone in the RF coil and the relative frequency of the slug zones and film zones in the flowing medium are determined using the reflected power with a jump in the value of the reflected power from a high value to a lower value used to trigger measurement initiation.

10 Claims, 3 Drawing Sheets

(56) References Cited

U.S. PATENT DOCUMENTS

| | | | |
|---|---|---|---|
| 2006/0020403 A1* | 1/2006 | Pusiol | G01F 1/716 702/45 |
| 2010/0145634 A1* | 6/2010 | Pinguet | G01F 1/46 702/45 |
| 2012/0209541 A1 | 8/2012 | Ong et al. | |
| 2013/0271134 A1* | 10/2013 | Nielsen | G01R 33/54 324/309 |
| 2014/0021948 A1* | 1/2014 | Pors | G01F 1/716 324/306 |
| 2014/0035582 A1* | 2/2014 | Boernert | G01R 33/5611 324/312 |
| 2015/0057979 A1* | 2/2015 | Suematsu | G01R 33/4625 702/190 |

FOREIGN PATENT DOCUMENTS

| | | |
|---|---|---|
| WO | 2004/099817 A2 | 11/2004 |
| WO | 2012/087120 A1 | 6/2012 |

* cited by examiner

250
METHOD FOR OPERATING A NUCLEAR MAGNETIC FLOWMETER

BACKGROUND OF THE INVENTION

Field of the Invention

The invention relates to a method for operating a nuclear magnetic flowmeter for determining the flow of a medium flowing through a measuring tube, in particular for determining the flow of a medium with slug flow, having a measuring device, wherein the measuring device contains an RF circuit having external electronics and having at least one RF coil designed for generating an excitation signal for exciting the medium and/or for detecting measuring signals emitted by the medium.

Description of Related Art

Nuclear magnetic flowmeters are designed for determining the flow of a medium flowing through a measuring tube. The medium can contain one phase or several phases. In the case of a single-phase medium, determination of the flow occurs by determining the flow velocity of the medium. Determining the flow of a multi-phase medium includes, in addition to determining the flow velocity, also determining the portions of the individual phases in the medium.

A prerequisite for using nuclear magnetic measuring methods is that the medium or each phase of the medium has atomic nuclei with magnetic moments. It is additionally necessary for distinction of individual phases that the phases have different relaxation times.

The multi-phase medium extracted from oil sources consists essentially of the two liquid phases crude oil and water and the gaseous phase natural gas, wherein all three phases contain hydrogen atoms that have a magnetic moment.

The medium flowing through the measuring tube can have different flow characteristics. This means that the individual phases of the medium can be unevenly distributed over a volume element. A flow that occurs often in media extracted from oil sources is slug flow. The slug flow has very complicated characteristics and is essentially characterized by a continuous disruption of a steady flow. A slug flow can be separated into two zones that occur alternately. The first zone is characterized by a slug of liquid medium, wherein the liquid medium fills the entire cross section of the measuring tube. Small gas bubbles are unevenly distributed in the liquid medium. This zone is called the slug zone. The second zone consists of a large gas bubble that occupies a dominating portion of the measuring tube cross section and a liquid film that fills the remaining part of the measuring tube cross section. This zone is called the film zone. The expansion of both alternating zones is arbitrary and irregular.

Nuclear magnetic flow measurements are wherein an excitation pulse exciting the medium is generated in external electronics, that the excitation pulse is fed into the medium using a RF coil and that the response of the excited medium is detected with a RF coil and also transmitted to external electronics for processing. A nuclear magnetic flowmeter thus includes at least one external electronic device and a RF coil with medium flowing through it, which together form a RF oscillation circuit. Hereby, the medium flowing through the RF coil must be considered as an additional load in the RF oscillation circuit.

The frequency of the RF circuit is set using so-called tuning so that resonance is achieved, i.e., the maximum possible signal.

In order to guarantee a maximum transmission of power between the external electronics and the RF coil, the impedance of the coil must be adjusted to that of the external electronics. This procedure is known as matching. An incorrect or inexact matching leads to the power not being completely transmitted, but rather partially reflected. If the power is reflected, not enough power is provided to the coil. This leads to the magnetic field $B_1$ generated by the RF coil not having the intended strength and, thus, the magnetization of the medium being deflected at a value smaller than the intended value.

An inadequate matching additionally leads to difficulties in the detection of measuring signals emitted by the sample. The measuring signal emitted by the sample, which is usually very small, "appears" even weaker when incorrectly "matched", which leads to a very bad signal to noise ratio.

In order to guarantee optimum measuring conditions, the tuning and matching have to be set before each nuclear magnetic flow measurement.

As already described, the settings for matching are dependent on the impedance of the RF coil. The additional load occurring due to the medium is taken into consideration in the value for the impedance of the RF coil. The load of the medium depends on the characteristics of the medium. If a medium having a slug flow characteristic flows through the measuring tube, the additional load in the RF oscillation circuit when a slug zone is located in the RF coil is different than when a film zone is located in the coil.

Consequently, the settings for matching have to be corrected for each zone, which is practically impossible or very complex and time consuming.

It is known from practice to use complex data analysis algorithms for data evaluation, which are able to differentiate between the two zones. These algorithms, however, are very complex, whereby data evaluation is time-consuming and additionally error-prone.

SUMMARY OF THE INVENTION

The primary object of the present invention is to provide a method for operating a nuclear magnetic flowmeter in which the disadvantages known from the prior art are minimized and data management is simplified.

The above derived and shown object is initially and essentially achieved in that the tuning parameters and the matching parameters are determined for a slug zone and a film zone, that the parameters are set for a slug zone or that the parameters are set for a film zone, that the reflected power is measured over a time t, wherein the reflected power in a system set for slug zone is low for the slug zone and high for the film zone and wherein the reflected power in a system set for film zone is low for the film zone and high for the slug zone, that the relative dwell time of the slug zone and the film zone in the RF coil as well as the relative frequency of the slug zones and film zones in the flowing medium are determined using the reflected power and that the jump in the value of the reflected power from a high value to a lower value is used as a trigger for starting measurement.

The method according to the invention is suitable in a particular manner for measuring media with a high salt content, in particular media with a large portion of saltwater that has a high salt content. In particular, in media with a very high salt content, the occurring loads vary to a large extent at high and low liquid volume ratios in the RF circuit, so that different measuring modes are indispensible for measuring different zones if complex data analysis it to be discarded.

In order to calibrate a flowmeter, i.e., to determine the tuning parameters and the matching parameters for each zone, namely the slug zone and the film zone, a curve describing the variations of the tuning parameters and the matching parameters can be recorded during calibration. A value for each parameter can then be determined for both the slug zone as well as the film zone using the curve.

A low value of the reflected power means that the parameters for matching are good, i.e., the power is (almost) completely transmitted from the external electronics to the RF coil, whereas the reflected power is high when the matching is bad. If the prameters are set for a certain zone, it can be determined using the reflected power, whether the zone for which the parameters are set or the other zone is located in the RF coil. Hereby, the reflected power must be measured in a good temporal resolution, i.e., sufficiently small time intervals are chosen between the individual measurements. By increasing the temporal resolution of the measurements, the accuracy of the detection of the slug zones and film zones in the medium is increased. The RF power, at which the reflection measurement is carried out, should be chosen sufficiently small in order to avoid disturbing the medium found in the RF coil.

It is guaranteed by the method according to the invention that the measurements are carried out with parameters adjusted to the specific load of the medium—depending on the zone of the medium found in the RF coil—i.e., that a slug zone is measured with slug zone settings and a film zone is measured with film zone settings. As opposed to the prior art, the method according to the invention has the advantage that a complex data-interpreting algorithm, which can differentiate between the two flow situations, is not required for data analysis.

A particular implementation of the method according to the invention is wherein the measurement that is triggered by a jump from a high to a low value of the reflected power, is a measurement for optimizing the tuning parameters and the matching parameters, that, beginning from the start parameters, further points in the tuning parameter range and in the matching parameter range are measured, wherein the number of measurement points is based on the known minimum slug dwell time and the time required for a single tuning measurement point and a single matching measurement point, that after recording the measurement point, the start parameter is set again and it is tested whether the reflected power still has a lower value and a part of the recorded measurement points is discarded or all of the recorded measurement points are discarded, if the reflected power has a high value.

The tuning settings and the matching settings can be optimized for both the slug zone as well as the film zone using this implementation of the method according to the invention.

A further preferred implementation of the method according to the invention is wherein the measurement that is triggered by a jump from a high to a low value of the reflected power is a nuclear magnetic measurement.

The method according to the invention has the possibility of using the data of the reflected power for accepting or discarding individual data points or measurement points from one single nuclear magnetic measurement. In particular, the data of the nuclear magnetic measurement can be discarded that were recorded at the time of a jump in the reflected power. Measurement during a jump occurs primarily when a nuclear magnetic measurement occurs over a period of time that is longer than the dwell time of the corresponding zone in the RF coil. If the time of measurement is longer than the dwell time, then the measurements are carried out at the "end" of the measurement with "incorrect" settings. In particular, it is then also provided that the data points or measurement points with the "incorrect" settings are recognized and discarded. Thus, the requirements on the data-interpreting algorithms used for data evaluation are lowered again and the effort required for data evaluation is considerably reduced.

A particular implementation of the method according to the invention is wherein the parameters are set for the slug zone of the medium. The nuclear magnetic measurement is implemented according to the invention using a CPMG sequence, wherein the method of pre-magnetization contrast measurement is used for nuclear magnetic measurement. Preferably, it is provided that data obtained using nuclear magnetic measurements is used for determining the flow velocity and the water to liquid ratio is determined with the aid of the signal amplitude data.

However, the method according to the invention is not limited to the use of a CPMG sequence, but rather any pulse sequence that is suitable for nuclear magnetic measurement is possible.

It can also be advisable to set the parameter for the slug zone and to implement the nuclear magnetic measurement using tomography. In particular, slicing in the z-direction can be provided for tomography. For defining the directions, a Cartesian coordinate system is taken as a basis, wherein the x-direction lies along the direction of flow and the x-axis forms a horizontal plane with the y-axis. The z-axis, thus, is perpendicular to the horizontal plane. The gas portion, i.e., the gas volume portion, is determined in the slug zone with the measured signal amplitudes. The flow velocity distribution in the slug zone can also be determined.

Since the gas volume portion is determined on the basis of signal amplitudes, it is indispensible that the correct parameters are set, i.e., the parameters for the corresponding zone of the medium. Incorrect parameters lead to unclear signal amplitudes, whereby the measurements are then no longer useful.

Determining the signal amplitudes and thus the gas volume portion is not possible using measurements with parameters not adjusted to the zone, however, according to the invention, it is provided in a particular implementation of the invention that a nuclear magnetic measurement is carried out in the film zone with slug zone settings. The flow velocity of the medium in the film zone can be determined from the measured values. Determining the flow rate occurs using the determined values from the measurements for the flow velocity and with previously determined values for the water to liquid ratio.

Particular implementations of the method according to the invention, in which the tuning parameters and the matching parameters are adjusted to a slug zone, have been described up to this point. According to the invention, implementations are also possible that use tuning parameters and matching parameters adjusted to a film zone as a basis.

A further implementation of the method according to the invention provides that the matching parameters are set for the film zone and the nuclear magnetic measurement is implemented with a CPMG sequence. Since, according to the method according to the invention, the nuclear magnetic measurement occurs after the jump of the measured values for the power from a high to a low value and—as already described—a low value means a good matching, the film zone of the medium can be characterized using this implementation of the method according to the invention. Preferably, the method of pre-magnetization contrast measurement is used and the flow velocity of the medium is determined with the measured data and the water to liquid ratio in the film zone is determined with the aid of the signal amplitude data.

However, the method according to the invention is not limited to the use of a CPMG sequence; rather any possible pulse sequence suitable for determining nuclear magnetic characteristics can be used.

A further implementation of the method according to the invention is wherein the nuclear magnetic measurement with tomography with layers in the z-direction is carried out with the matching parameters for the film zone. The gas portion (gas volume fraction) in the film zone is determined with the measured signal amplitudes. It is also provided that the liquid level in the measuring tube is determined using the measured data.

As already described, it is indispensible that the matching parameters are adjusted to the specific zone for clearly determining the signal amplitudes and thus for determining the gas volume portion in a particular zone of the medium.

Then again, a particular implementation of the method is wherein a nuclear magnetic measurement is carried out in the slug zone with film zone parameters. The flow velocity of the medium in the slug zone can then be determined from the measured values. Determining flow rates occurs using determined values from the measurements for the flow velocity and using previously determined values for the water to liquid ratio.

A further preferred implementation in which the nuclear magnetic measurement is implemented using tomography with slicing in the z-direction provides that the nuclear magnetic measurement occurs over a time period that includes at least one slug zone and one film zone. Hereby, the matching parameters can correspond to the parameters of the slug zone, however it can also be provided that the parameters correspond to the parameters of the film zone. Consequently, in either case, there are zones with higher and lower reflected power. Preferably, it is now provided that the flow velocity for every point in time of measurement is determined with the data obtained from tomography and that the flow velocity can be assigned to a zone using the data of the reflected power.

Up until this point, it has been assumed that the medium has a high salt content, in particular, that saltwater has a high salt content and/or the saltwater portion in the medium is high. However, it is also possible that the saltwater portion in the medium is low or that the salt content in the saltwater is low or almost zero.

As already described, the additional load in the RF oscillation circuit caused by the flowing medium is dependent, on the one hand, on the zone located in the RF coil and, on the other hand, on the salt content of the medium. Consequently, the amount of reflected power is dependent on the salt content of the medium. If the medium has a low or non-existent salt content, the load in the RF circuit is nearly identical for the slug zone and the film zone, so that the tuning parameters and the matching parameters are the same for both zones. Differentiating the zones on the basis of the reflected power, as described above, is thus not possible.

In the scope of the invention, the slug zone and the film zone in a medium with slug flow can be differentiated on the basis of signal amplitudes instead of on the basis of reflected power. Insofar, a particular teaching of the invention is wherein the tuning parameter and matching parameter are set for a slug zone or for a film zone, that a nuclear magnetic measurement is carried out, that, using the signal amplitudes, it is determined whether a slug zone or a film zone is located in the RF coil and that the water to liquid ratio and/or the gas volume portion are determined in the slug zone and the film zone.

A CPMG sequence or another pulse sequence for measuring nuclear magnetic variables can be used for the nuclear magnetic measurement. It is also possible that the nuclear magnetic measurement is implemented using tomography with layers in the z-direction.

In nuclear magnetic tomography, different ordering schemes are known, according to which the data can be detected—in particular in the Fourier space.

There are special requirements, in particular, in the use of nuclear magnetic tomography in the field of flow measurement of flowing media that have no steady, in particular no stationary flow characteristics. Thus, some pulse sequences are particularly suitable for a high temporal resolution, however, a very high homogeneity of the externally applied magnetic field is indispensible for this. Pulse sequences that are not sensitive to field inhomogeneity do not achieve such high temporal resolutions.

Preferably, the ordering scheme according to the golden ratio is used for data acquisition in the scope of the method according to the invention. This method is originally known from the field of medical imaging, in particular, it is used in examining the heart or lung.

The ordering scheme based on the golden ratio specifies an organization in which data profiles are recorded in the reciprocal space. It guarantees a nearly uniform distribution of the data profile for an arbitrary number of data profiles. The ordering scheme provides recording data profiles in an azimuthal increment of 111.25°, the golden ratio of 180°. Consequently, the radial lines are distributed over time very uniformly over the space. This guarantees that the profiles are evenly distributed regardless of the number of profiles used for image reconstruction—in particular, however, when the number of profiles used for image reconstruction corresponds to a Fibonacci number. This results in several advantages, which are of particular relevance for flow measurement of a medium having slug flow characteristics. Thus, the number of profiles used for image reconstruction can be arbitrarily chosen. If a fast temporal resolution is necessary, then few profiles can be used, and, on the other hand, data reconstruction using a plurality of profiles is used for a high temporal resolution. This method has a great advantage over previously used methods in flowmeter technology in that image reconstruction can be spontaneously, variably adapted to the prevailing conditions and does not need to be established before measurement. Thus, the length of the measuring window can be arbitrarily chosen. Due to the organization pattern according to the golden ratio, a uniform distribution of the data in the Fourier spectrum is guaranteed for every point in time. Thus, it is no longer necessary to previously establish the required temporal resolution or image-renewing rate beforehand. Moreover, the number of profiles used for data reconstruction can be adjusted in retrospect in order to make a compromise of image quality and temporal resolution adapted to the situation over and over again. For example, the number of profiles can be adapted to the length of the slug zone and the film zone.

Since each profile is executed through the origin of the reciprocal space, the absolute signal amplitude is detected in each profile. It can be detected with the signal amplitude whether the zone is a slug zone or a film zone.

It is also possible to keep the position of the data acquisition window random. Subsequent profiles are distributed roughly over the entire reciprocal space. Thus, a nearly uniform profile distribution is guaranteed over the entire reciprocal space, regardless of when the data acquisition was started. The data can then be adapted to specific intervals.

It can also be provided to merge several data acquisition windows together. The flexibility of data acquisition allows for several data acquisition windows that merge together during different intervals, but are recorded in the same zone. Thus, for example, it can be provided to combine data from a first slug zone with data from a second slug zone, whereby the resolution of the combined image is improved.

A further implementation of the method according to the invention is wherein a quasi-random ordering scheme is used for data acquisition. Such ordering schemes based on quasi-randomizing or subrandomizing also guarantee a nearly homogeneous distribution of the data profiles for an arbitrary number of data profiles used for data acquisition. Ordering schemes of this type are based on low discrepancy sequences. Low discrepancy sequences are also called quasi-random sequences. As opposed to purely deterministic methods quasi-random sequences have the advantage that they allow a homogeneous distribution in spite of a not predetermined number of data profiles, therefore the number of data profiles may be adjusted subsequently to the current conditions of the flow measurement. In particular, the Halton sequence, the van der Corput sequence and the Faure sequence are well suited for data acquisition.

In particular, there is now a host of possibilities for developing the method for operating a nuclear magnetic flowmeter.

DETAILED DESCRIPTION OF THE INVENTION

Figure 1:
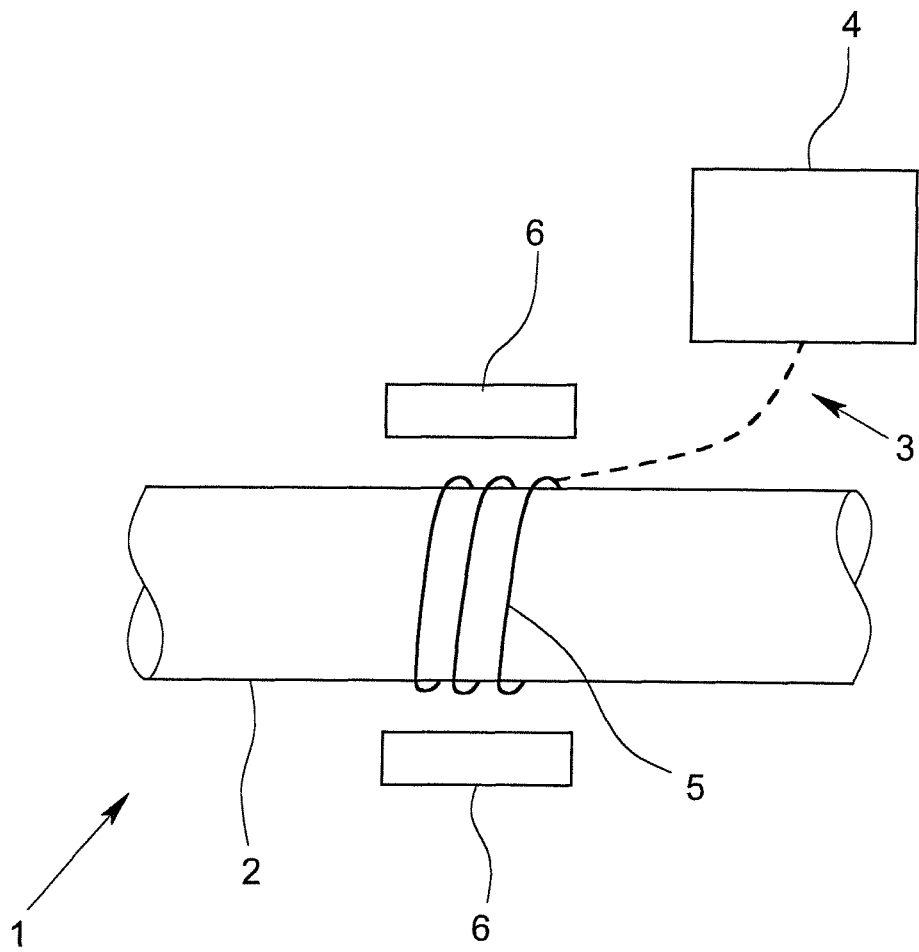
FIG. 1 is a schematic drawing of a nuclear magnetic flowmeter.
Figure 2:
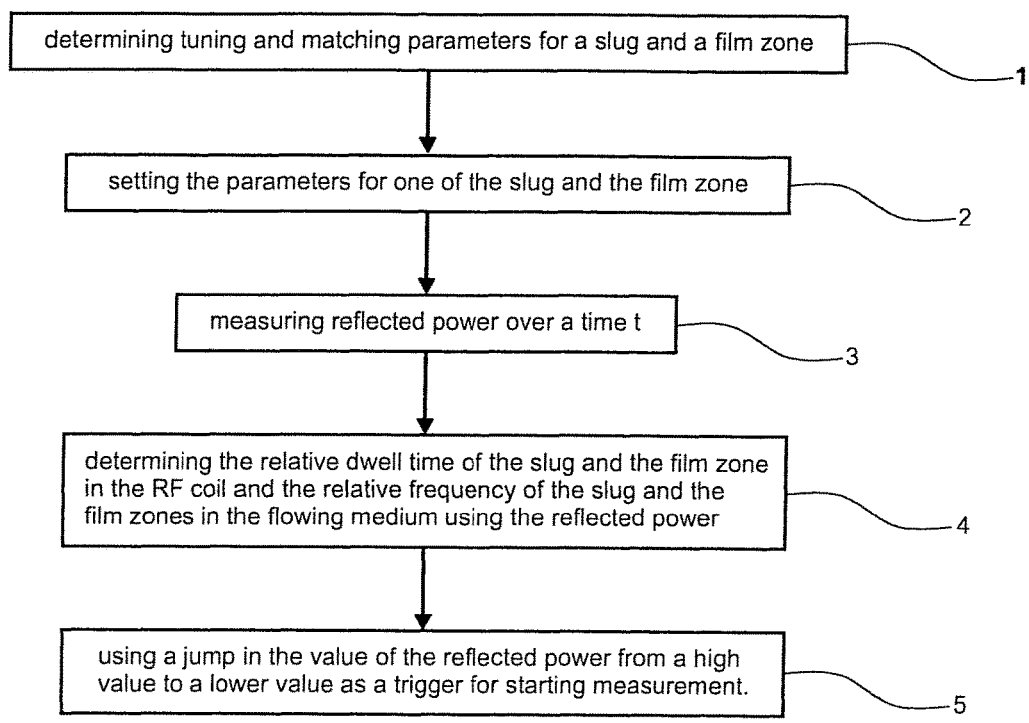
FIG. 2 is a flow chart of the method of the invention.
Figure 3:
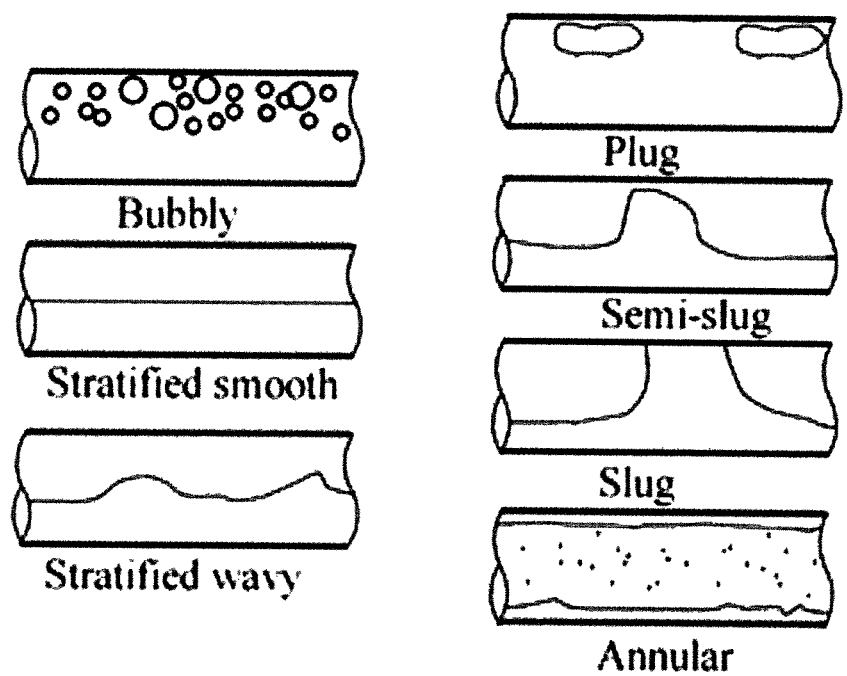
FIG. 3. depicts the different flow regimes of the flow of a multi-phase medium.

FIG. 1 shows a nuclear magnetic flowmeter 1 for determining the flow of a medium flowing through a measuring tube 2. The nuclear magnetic flowmeter 1 has a measuring device 3, which is formed of external electronics 4 and an RF coil 5. The tuning and matching parameters are determined and set by the external electronics 4. In addition, the external electronics 4 serve for generating an excitation pulse which is injected into the medium by the RF coil 5. Measuring signals emitted by the medium are also detected by the RF coil 5 and are transmitted to the external electronics 4 for processing. Reference number 6 represents a conventional magnetization device as is found in all nuclear magnetic flowmeters.

The method for operating the nuclear magnetic flowmeter 1 for determining the flow of a medium through measuring tube 2, in particular for determining the flow of a medium with slug flow, with the measuring device 3 having the RF circuit with external electronics 4 and RF coil 5 with which an excitation signal is generated for exciting the medium and/or for detecting measuring signals emitted by the medium, involves the steps of:

determining the tuning parameters and the matching parameters for a slug zone and for a film zone, setting the parameters for one of the slug zone and film zone, measuring reflected power over a time t, wherein the reflected power in a system set for slug zone is low for the slug zone and high for the film zone and wherein the power in a system set for film zone is low for the film zone and high for the slug zone, determining the relative dwell time of the slug zone and the film zone in the RF coil as well as the relative frequency of the slug zones and film zones in the flowing medium are using the reflected power and using a jump in the value of the reflected power from a high value to a lower value as a trigger for starting measurement.

What is claimed is:

1. A method for operating a nuclear magnetic flowmeter for determining the flow of a medium flowing through a measuring tube with a slug flow using a measuring device having an RF circuit with external electronics and having at least one RF coil with which an excitation signal is generated for at least one of exciting the medium and detecting measuring signals emitted by the medium, comprises the steps of:

determining tuning parameters and matching parameters for a slug zone of the slug flow and for a film zone of the slug flow, setting parameters for one of the slug zone and film zone, measuring reflected power of the measuring signal emitted by the medium over a time t, wherein the reflected power in a system set for the slug zone is low for the slug zone and high for the film zone and wherein reflected power in a system set for film zone is low for the film zone and high for the slug zone, determining a relative dwell time of the slug zone and the film zone in the RF coil as well as relative frequency of the slug zones and film zones in the flowing medium using the reflected power and triggering measurement of the medium flowing through the measuring tube based on a jump in the value of the reflected power from a high value to a lower value.

2. The method according to claim 1, optimizing tuning parameters and matching parameters using the measurement beginning from start parameters, measuring points in a tuning parameter range and in a matching parameter range and recording each of the points measured, basing a number of measurement points to be used on a known minimum slug dwell time and a time required for a single tuning measurement point and a single matching measurement point, wherein, after recording each of the points measured, again setting the start parameter and testing whether the reflected power still has a lower value, and discarding at least a part of the recorded points measured if the reflected power has a high value.

3. The method according to claim 1, accepting or discarding individual data from the nuclear magnetic measurement based upon data of the reflected power, discarding the data of the nuclear magnetic measurement that was recorded at the time of the jump in the reflected power or discarding the data of the nuclear magnetic measurement that were recorded with "incorrect" tuning parameters or matching parameters.

4. The method according to claim 3, setting the tuning parameters and the matching parameters for the slug zone, implementing tomography with slicing in a direction perpendicular to a horizontal plane using the nuclear magnetic measurement and determining a gas volume fraction in the slug zones with measured signal amplitudes emitted by the medium flowing through the measuring tube and determining a flow velocity distribution in the slug zone.

5. The method according to claim 4, setting the tuning parameters and the matching parameters for the film zone, performing the nuclear magnetic measurement using pre-magnetization contrast measurement with a pulse sequence for determining nuclear magnetic variables, determining the flow velocity is with measurement data and determining a water to liquid ratio with signal amplitudes.

6. The method according to claim 5, carrying out the nuclear magnetic measurement with tuning parameters and matching parameters for the film zone in the slug zone, determining the flow velocity with the measured values and calculating the flow rate with values determined for the flow velocity and previously determined values for the water to liquid ratio.

7. The method according to claim 1, setting the tuning parameters and the matching parameters the slug zone, implementing the nuclear magnetic measurement with a CPMG sequence or another pulse sequence for determining nuclear magnetic variables, performing pre-magnetization contrast measurement to obtain measurement data and determining flow velocity with the measurement data and determining a water to liquid ratio with amplitudes of signals emitted by the medium flowing through the measuring tube.

8. The method according to claim 7, performing the nuclear magnetic measurement with tuning parameters and matching parameters for the slug zone in the film zone, determining flow velocity of the medium flowing through the measuring tube with measured values and calculating flow rate of the medium flowing through the measuring tube with values for the flow velocity and values for the water to liquid ratio determined previously.

9. The method according to claim 1, setting the tuning parameter and matching parameter for the film zone, performing the nuclear magnetic measurement in a manner implementing tomography with slicings in a direction perpendicular to a horizontal plane and determining a gas volume fraction in the film zone as well as the liquid level with measured signal amplitudes.

10. The method according to claim 1, implementing measurement using nuclear magnetic tomography with layers in a direction perpendicular to a horizontal plane and carrying out measurement over a time period encompassing at least one slug zone and one film zone, determining flow velocities from measured data and assigning the flow velocities to a zone using data of the reflected power.

* * * * *